United States Patent [19]
Basi

[11] 3,869,323

[45] Mar. 4, 1975

[54] METHOD OF POLISHING ZINC SELENIDE

[75] Inventor: Jagtar Singh Basi, Wappingers Falls, N.Y.

[73] Assignee: International Business Machines Corporation, Armonk, N.Y.

[22] Filed: Dec. 28, 1973

[21] Appl. No.: 429,240

[52] U.S. Cl. ...................... 156/17, 156/20, 252/79.5

[51] Int. Cl. ............................................. H01l 7/50

[58] Field of Search ...... 156/17, 20; 252/79.1, 79.5; 117/47, 54

[56] References Cited

UNITED STATES PATENTS

| | | | |
|---|---|---|---|
| 2,822,250 | 2/1958 | DeNobel | 156/17 |
| 3,143,447 | 8/1964 | Norr | 156/17 |
| 3,342,652 | 9/1967 | Reisman et al. | 156/17 |
| 3,429,756 | 2/1969 | Groves | 156/17 |
| 3,629,023 | 12/1971 | Strehlow | 156/17 |
| 3,775,201 | 11/1973 | Basi | 156/17 |

*Primary Examiner*—William A. Powell
*Attorney, Agent, or Firm*—Rothwell, Mion, Zinn & Macpeak Sughrue

[57] ABSTRACT

Zinc selenide with damage-free surfaces is obtained by chemically-mechanically polishing using a chemical polishing system including a water soluble alkali or alkaline earth metal hypohalite.

11 Claims, No Drawings

METHOD OF POLISHING ZINC SELENIDE

BACKGROUND OF THE INVENTION

1. Field of the Invention

This invention relates to a process for polishing planar zinc selenide surfaces to a high degree of surface perfection.

2. Description of the Prior Art

Semiconductor devices such as integrated monolithic circuits, diodes, passive devices, and the like, are formed by various additive techniques, such as diffusion and epitaxial growth in the planar surface of semiconductor materials. Zinc selenide is a well-known material utilized for the manufacture of such devices. The perfection of the zinc selenide surface in regard to surface fine-structure conditions down to an order of Angstrom units, surplus planarity, uniformity and freedom of mechanical damage and flatness is a fundamental requirement for the manufacture of semiconductor devices.

It is advantageous and desirable to have zinc selenide wafers or slices having highly polished surfaces prior to the performance of processing steps where effectiveness may be decreased by the presence of undesirable surface conditions and contaminants. Such processing steps might include, for example, the formation of epitaxial layers on the slice, the controlled diffusion of impurities into the slice or thermal treatment or final encapsulation of the device.

The surface planarity of the wafer is critical in photolithographic masking techniques because of the constant effort to decrease the physical size of the device. Any increase in distance between the mask and the wafer surface caused by significant deviations from the ideally planar wafer unfavorably effects the image resolution of fine device structure on the surface of the wafer. Poor device yields are the result at the periphery of the wafer where a non-planarity becomes more pronounced as one proceeds towards the edge or outside periphery of the wafer for device formation. The surface characteristics over the entire wafer are also extremely important characteristics as they can produce poor devices throughout the wafer. Mechanical or physical defects and irregularities in the planar wafer surface also produce marginal or useless devices throughout the entire surface which also can result in a waste of manufacturing time and excess cost due to low yield.

The surface characteristics of zinc selenide become especially critical where the optical characteristics of the zinc selenide are to be utilized.

The prior art has suggested chemical etching and mechanical polishing in order to obtain a damage-free zinc selenide surface.

In theory, if perfect zinc selenide were available, chemical etching could be used to successfully obtain a damage-free zinc selenide surface. However, zinc selenide always has crystalline defects and at areas where such crystalline defects exist etching proceeds at a rapid rate as compared to areas free of such crystalline defects. Accordingly, following prior art chemical etching procedures the well-known "orange peel effect" is encountered, which makes it impossible to obtain a damage-free zinc selenide surface.

As will be apparent to one skilled in the art, differential etching rates are encountered to a substantial extent with polycrystalline materials because of the differing crystallographic orientation of such materials.

Usual mechanical polishing procedures involve a series of abrading and polishing steps using polishing ingredients of graduated fineness. In this manner, most surface scratches can be removed, however, damage to the crystal structure just below the surface caused by preceding courser mechanical polishing steps cannot be removed.

Accordingly, whether prior art chemical etching or mechanical polishing techniques are used, it is impossible to obtain a damage-free zinc selenide surface.

U.S. Pat. No. 3,738,882 Basi discloses that gallium arsenide can be polished using sodium hypochlorite and sodium carbonate. There is no suggestion in this patent of the chemical-mechanical polishing of zinc selenide nor is there any suggestion that other alkali metal or alkaline earth metal materials such as sodium hypobromite are useful for the chemical-mechanical polishing of cadmium telluride in accordance with the present invention.

It is also known that gallium phosphide can be polished using an oxybromide solution.

SUMMARY OF THE INVENTION

It is an object of this invention to provide a method for polishing zinc selenide surfaces to a high degree of perfection.

It is a further object of this invention to provide a method or process for obtaining high quality damage-free planar polishes on all zinc selenide crystallographic orientations.

It is another object of this invention to provide a process which enables polishing of single crystal and polycrystalline zinc selenide independent of conductivity type to produce a highly polished featureless planar surface.

In accordance with the present invention, polished zinc selenide having a damage-free surface is obtained by chemical-mechanical polishing using a stable, water soluble alkali or alkaline earth metal hypohalite, whereby the defects of the prior art enumerated above are overcome and the objects of the present invention are fully realized.

The present invention is specific to chemical-mechanical polishing, which differs substantially from either mechanical polishing or chemical etching. For example, in the chemical-mechanical polishing of zinc selenide the alkali metal or alkaline earth metal hypohalite chemical polishing solution reacts with the zinc selenide wafer surface, whereafter the reaction product is removed by a polishing surface (mechanical polishing) to expose fresh zinc selenide which is, in turn, subjected to the described reaction/removal procedure.

DETAILED DESCRIPTION OF THE INVENTION

The zinc selenide surface which is generally used as a starting material in the chemical-mechanical polishing process of the present invention is in the form of a thin wafer. Such wafers are usually sawed from cylinders of zinc selenide and lapped on a lapping machine using a fine abrasive such as alumina grit. At this stage, the zinc selenide wafer surface is fairly uniform but is mechanically damaged. The polishing procedure of the present invention is generally initiated subsequent to such "pre-polishing." While pre-polishing is not necessary, on a commercial scale it is beneficial to pre-polish so the chemical-mechanical polishing of the present invention need be used only for the final critical polishing stages.

The chemical-mechanical polishing techniques of the present invention can be practiced using conventional apparatus available to the art. For example, the polishing apparatus as disclosed in U.S. Pat. No. 3,436,259 Regh et al., can be used with success in the present invention.

In general, the polishing apparatus includes a bowl having a fluid inlet and fluid outlet which contains a plate, and mounted on the plate by any suitable means is a soft, firm surface which will polish the zinc selenide wafers. A smaller plate on which the zinc selenide wafers to be polished are mounted is placed in close adjacency to the first plate. The smaller plate with the zinc selenide wafers mounted thereon is generally urged against the polishing surface in an upward manner. While both plates can be driven, usually the polishing surface plate is the driven plate which is rotated while the zinc selenide wafers are passed thereunder and in contact with the polishing surface. Typical of the polishing surfaces which can be used in the present invention are the Politex materials, which are commercially available. Simultaneous with the relative motion of the zinc selenide wafers and their contact with the polishing surface the chemical polishing solution of the present invention is flowed over the wafers, usually by being dripped onto the zinc selenide wafers through the polishing surface which is porous, whereby the zinc selenide wafers are chemically-mechanically polished by their contact with the rotating polishing surface and the chemical polishing solution of the present invention.

Needless to say, the apparatus disclosed in U.S. Pat. No. 3,436,259 Regh et al. is merely one means for affecting the relative motion between the zinc selenide wafers and the polishing surface while contacting the zinc selenide wafers with the chemical polishing solution of the present invention, and any equivalent apparatus which performs the two required functions can be used.

Turning now to the chemical polishing solution of the present invention, the essential constituent of the chemical polishing solution is a stable, water soluble alkali metal or alkaline earth metal hypohalite, the term "stable" implying that the hypohalite does not decompose during chemical-mechanical polishing.

The alkali metal hypohalites are most preferred, and of these materials sodium and potassium are, considering cost and availability, most preferably used. Lithium, rubidium and cesium will find little practical use in view of their increased cost.

The alkaline earth metal hypohalites are of secondary interest, and of these materials calcium is preferred.

Chlorine and bromine are the preferred halides. Fluorine and iodine will find little practical use due to their tendency toward instability in the hypohalite form.

Most preferred of the alkali metal hypohalites are sodium hypochlorite and sodium hypobromite, with sodium hypochlorite offering results so substantially superior to sodium hypobromite that the difference is one of kind. No clear reason seems to exist as to why alkali metal hypochlorites are superior in kind to other alkali metal or alkaline earth hypohalites in the polishing of zinc selenide. Logically, one would expect these hypohalites to be substantially equivalent in results. However, greatly superior results are obtained with alkali metal hypochlorites, specifically sodium hypochlorite, as compared to other hypohalites.

In the hypohalites, the oxygen moiety can be viewed as the active chemical polishing agent, the alkali metal or alkaline earth metal can be viewed as a carrier for the oxygen moiety and the halide moiety can be viewed as a modifier.

So long as an insoluble precipitate is not formed, the alkali metal or alkaline earth metal hypohalites can be used in combination with a water soluble alkali metal carbonate or bicarbonate.

The use of an alkali metal bicarbonate is strongly preferred in instances where sodium hypochlorite is used since, as commercially available, sodium hypochlorite typically contains some sodium hydroxide, sodium chloride and the like. While sodium chloride is inert in the chemical polishing solution of the present invention, strong bases such as sodium hydroxide must be avoided since they are detrimental to zinc selenide surface quality. Sodium bicarbonate will serve to remove strong bases such as sodium hydroxide, thereby insuring perfect zinc selenide surfaces are obtained. The sodium bicarbonate is merely used in an amount effective to "neutralize" any strong bases which might be present.

The presence of an alkali metal carbonate, an optional feature in the present invention, serves to enhance chemical-mechanical polishing. The preferred carbonate is sodium carbonate. The alkali metal carbonate, if used, is in equimolar or greater proportion based on the hypohalite present. The alkali metal carbonate should not be used with the hypohalites which form a precipitate therewith, e.g., lithium hypochlorite.

Considering the above factors, most preferably the chemical polishing solution of the present invention is used at a pH of above 8, more preferably at a pH within the range of 9 to 11.

Hereafter, for purposes of brevity, the alkali metal or alkaline earth metal hypohalite will often be referred to as the "active component" of the chemical polishing solution of the present invention.

The chemical polishing solution of the present invention is used in the form of an aqueous solution. If desired, a portion of the water used to dissolve the active components of the present invention can be replaced by other organic or inorganic solvents which are inert to the system. Generally speaking, however, little is to be gained by replacing the water in the chemical polishing solution with such "secondary" solvents since they merely serve to complicate the system without providing any substantial additional benefits.

Further, inert materials can be present in the chemical polishing solution, for instance, nitrates and sulfates. Since such inert materials have no substantial beneficial or adverse influence upon the chemical-mechanical polishing of the present invention, they will generally not be used.

The amount of active components present in the chemical polishing solution of the present invention is not overly critical, but certain compositions where most preferred results are obtained do exist. Generally, the hypohalite will be present in a concentration of about 0.2 molar to about 0.8 molar, with optimum results being obtained at about 0.4 molar concentrations.

Greater amounts of the hypohalites can be used, of course, but at higher proportions no substantial benefits are obtained as compared to the use of about 0.8 molar systems, and at exceedingly high proportions of hypohalites, the chemical polishing solutions show a tendency to become unstable and reproducibility is difficult.

Conversely, if proportions of hypohalites much below about 0.2 molar are used, a decrease in chemical polishing activity will be encountered, with lessening proportions of hypohalites providing correspondingly less effective results. The difference is not one of kind, however, rather it is a fall off in degree of effectiveness. Accordingly, if only small amounts of material are to be removed, for instance, a few microns, a chemical polishing solution which contain less than 0.2 molar hypohalite can act as an effective polishing agent.

During the chemical-mechanical polishing of the present invention, the chemical polishing solution is flowed over the zinc selenide wafers as they are being polished at high flow rates. The exact flow rate required will, of course, vary greatly depending upon the amount of polishing to be accomplished on a specific set of zinc selenide wafers, the polishing pressure, the amount of active components present and other factors.

The only important criterion which must be observed is that sufficient chemical polishing solution must always be present so that reaction with freshly exposed zinc selenide is insured as reaction product is removed by the mechanical polishing. Establishing the exact flow rate used will be well within the skill of the art and can be accomplished merely by a few trial process runs, usually starting with a low flow rate of the chemical polishing solution and increasing the flow rate until the desired chemical-mechanical polishing is obtained.

For most commercial operations, usually the flow rate of the chemical polishing solution will be from about 4 ml/min. to about 50 ml/min. per micron of zinc selenide to be removed.

An important parameter in the chemical-mechanical polishing which must be observed is to maintain relative motion between the zinc selenide wafer surface being polished and the polishing surface at a certain critical applied pressure. In the chemical-mechanical polishing technique of the present invention, it is essential that the pressure be maintained within the range of from about 100 to about 500 $gm/cm^2$ of polished zinc selenide wafer area, and it is even more preferred that the pressure be maintained within the range of from 200 $gm/cm^2$ to 300 $gm/cm^2$ of exposed zinc selenide wafer area. If the pressure is not maintained within this range, a yellow surface film results.

By following the above general guidelines on the pressure of chemical-mechanical polishing and on chemical polishing solution flow rates, zinc selenide wafers can be efficiently polished to have a damage-free, substantially perfect surface at zinc selenide removal rates of 1 mil per hour or higher, a substantial commercial benefit.

The chemical-mechanical polishing of the present invention is generally performed at ambient temperature and with a system open to the atmosphere, though of course there is nothing in the mechanism of the polishing procedure to prohibit the use of higher or lower temperatures, and/or pressures, if one desires to use the same.

The rate of relative rotation between the zinc selenide wafer surfaces and the polishing surface is not overly important. Most commercially available polishing devices as are used in practicing the present invention operate over the rotation range of about 30 to about 100 r.p.m. using a 12-inch polishing wheel, and good results are obtained over this entire range.

The final step in the process of the present invention is preferably to free the polished surface of the zinc selenide of any residual chemical polishing solution. This is performed in a simple manner by replacing the flow of chemical polishing solution with a flow of a non-polishing medium, such as water, whereafter the polished zinc selenide wafers having damage-free surfaces can be removed from the polishing apparatus.

Having thus discussed the invention in general, the following working example illustrates a specific procedure effected utilizing the chemical-mechanical polishing technique of the present invention. Unless otherwise indicated, all percentages and parts are by weight.

EXAMPLE 1

Eight polycrystalline circular zinc selenide wafers ¼ inch thick and having a surface area of 2 $in.^2$ (side to be polished) were polished in accordance with the present invention.

The zinc selenide wafers were initially lapped with alumina grit using standard state-of-the-art techniques.

The eight wafers were then mounted in a polishing apparatus as described in U.S. Pat. No. 3,436,259 Regh et al., a 12 inch circular polishing plate being used.

The chemical polishing solution of the present invention comprised an aqueous solution of sodium hypochlorite (0.4 molar) and sodium carbonate (equimolar to the sodium oxychlorite).

The chemical polishing solution was dripped onto the polishing surface, which in this instance was a Politex polishing pad, at a rate of 10 cc/min. and the zinc selenide wafers brought into contact the polishing surface while maintaining a pressure of 300 $g/cm^2$ and a rotation rate of about 65 rpm.

After one hour of chemical-mechanical polishing at the above conditions, one mil of zinc selenide was removed.

Following chemical-mechanical polishing, the dropping of the chemical polishing solution was discontinued and the zinc selenide wafers washed with deionized water and dried under a nitrogen atmosphere.

Examination of the zinc selenide wafer surfaces showed that they were transluscent and had an extremely high degree of surface perfection. No preferential etching along grain boundaries were visible under microscopic examination.

Chemical-mechanical polishing was at ambient temperature in a system open to the atmosphere.

Similar runs were performed with other chemical polishing solutions, i.e., $CrO_3$; $K_2Cr_2O_7$ and $KM_nO_7$ acidified with either $HNO_3$ or HF, but in all instances the surface of the zinc selenide remained pitted, even after prolonged polishing.

While the invention has been particularly shown and described with reference to the preferred embodiment thereof, it will be understood by those skilled in the art that various changes in form and details may be made therein without departing from the spirit and scope of the invention.

What is claimed is:

1. A method for polishing a zinc selenide surface to a high degree of surface perfection comprising:

maintaining said zinc selenide surface continuously wetted with an excess quantity of an aqueous chemical polishing solution comprising an alkali metal or alkaline earth metal hypohalite; and continuously wiping the zinc selenide surface with a firm surface using a substantial pressure while maintaining a relative movement between the zinc selenide surface and the firm surface to remove the zinc selenide from the high points of the zinc selenide surface.

2. The process of claim 1, where the hypohalite is an alkali metal hypohalite.

3. The process of claim 2, where the alkali metal is sodium or potassium.

4. The process of claim 3, where the halite moiety comprises bromine or chlorine.

5. The process of claim 1, where the hypohalite is sodium hypochlorite.

6. The process of claim 1, where the concentration of hypohalite is about 0.2 to about 0.8 molar in said aqueous chemical polishing solution.

7. The process of claim 6, where said substantial pressure is from about 100 to about 500 gm/cm$^2$ of zinc selenide undergoing chemical-mechanical polishing.

8. The process of claim 7, where said pressure is from 200 to 300 gm/cm$^2$ of zinc selenide undergoing chemical-mechanical polishing.

9. The process of claim 8, where the concentration of hypohalite in said aqueous chemical polishing solution is about 0.4 molar.

10. The process of claim 9, where said hypohalite is sodium hypochlorite.

11. The process of claim 10, where said aqueous chemical polishing solution further comprises sodium carbonate.

* * * * *